(12) United States Patent
Dekker et al.

(10) Patent No.: US 7,736,948 B2
(45) Date of Patent: Jun. 15, 2010

(54) METHOD OF MANUFACTURING A PLURALITY OF SEMICONDUCTOR DEVICES AND CARRIER SUBSTRATE

(75) Inventors: Ronald Dekker, Eindhoven (NL); Greja Johanna Adriana Maria Verheijden, Leuven (BE); Theodorus Martinus Michielsen, Eindhoven (NL); Carel Van Der Poel, Eindhoven (NL); Cornelis Adrianus Henricus Antonius Mutsaers, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 10 days.

(21) Appl. No.: 12/093,337

(22) PCT Filed: Nov. 3, 2006

(86) PCT No.: PCT/IB2006/054093

§ 371 (c)(1),
(2), (4) Date: May 12, 2008

(87) PCT Pub. No.: WO2007/054869

PCT Pub. Date: May 18, 2007

(65) Prior Publication Data

US 2008/0315440 A1  Dec. 25, 2008

(30) Foreign Application Priority Data

Nov. 11, 2005  (EP)  .................. 05110650

(51) Int. Cl.
*H01L 21/00* (2006.01)

(52) U.S. Cl. .......... 438/106; 29/829; 438/455; 438/458; 257/E21.506; 257/E21.573; 257/E21.6; 257/E21.244; 257/E21.237; 257/E21.32

(58) Field of Classification Search ............. 29/829; 438/106, 455, 456, 458; 257/E21.506, E21.573, 257/E21.6, E21.244, E21.237, E21.32
See application file for complete search history.

(56) References Cited

U.S. PATENT DOCUMENTS

| | | | |
|---|---|---|---|
| 5,258,325 A * | 11/1993 | Spitzer et al. | 438/107 |
| 6,027,958 A | 2/2000 | Vu et al. | |
| 6,177,295 B1 | 1/2001 | De Samber et al. | |
| 6,198,155 B1 | 3/2001 | Verhaegh et al. | |
| 6,372,608 B1 | 4/2002 | Shimoda et al. | |
| 6,479,890 B1 | 11/2002 | Trieu et al. | |
| 6,762,510 B2 | 7/2004 | Fock et al. | |
| 2003/0157783 A1 * | 8/2003 | Fonash et al. | 438/458 |
| 2004/0036078 A1 | 2/2004 | Kondo | |
| 2004/0234717 A1 | 11/2004 | Sheats et al. | |
| 2005/0148121 A1 | 7/2005 | Yamazaki et al. | |

FOREIGN PATENT DOCUMENTS

| | | |
|---|---|---|
| WO | WO03060986 A2 | 7/2003 |
| WO | WO2005091370 A1 | 9/2005 |

* cited by examiner

Primary Examiner—Davienne Monbleau
Assistant Examiner—Farid Khan

(57) ABSTRACT

Individual devices (100) are locally attached to a carrier substrate (10), so that they can be removed therefrom individually. This is achieved through the use of a patterned release layer, particularly a layer that is removable through decomposition into gaseous or vaporized decomposition products. The mechanical connection between the carrier substrate (10) and the individual devices (100) is provided by a bridging portion (43) of an adhesion layer (40).

10 Claims, 11 Drawing Sheets

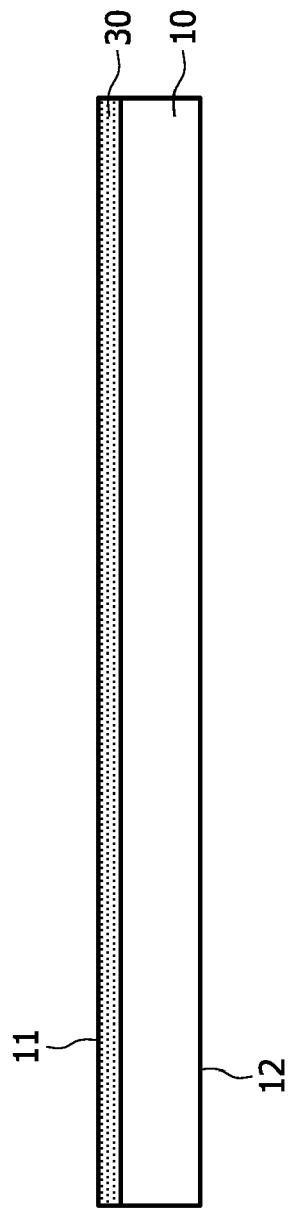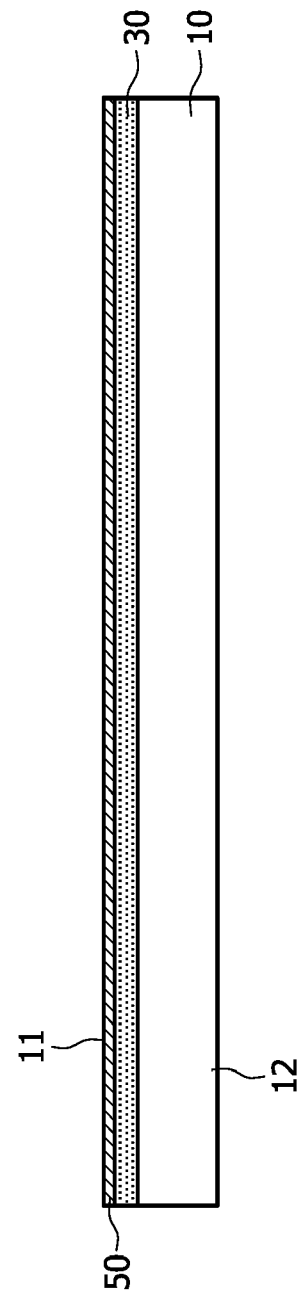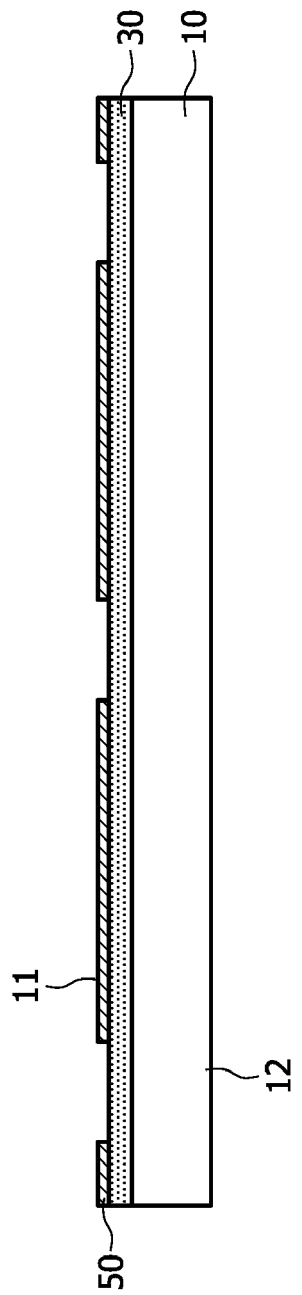

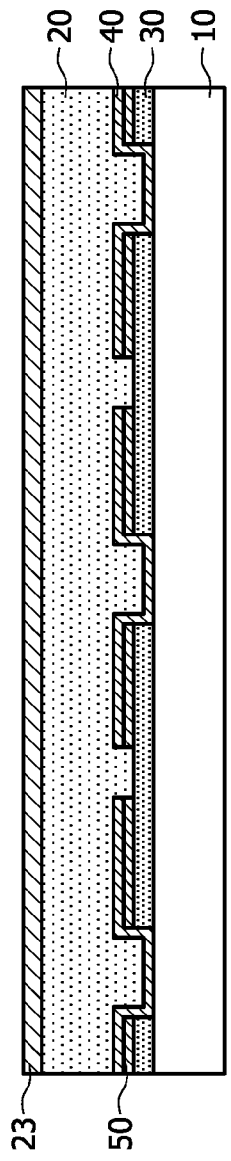
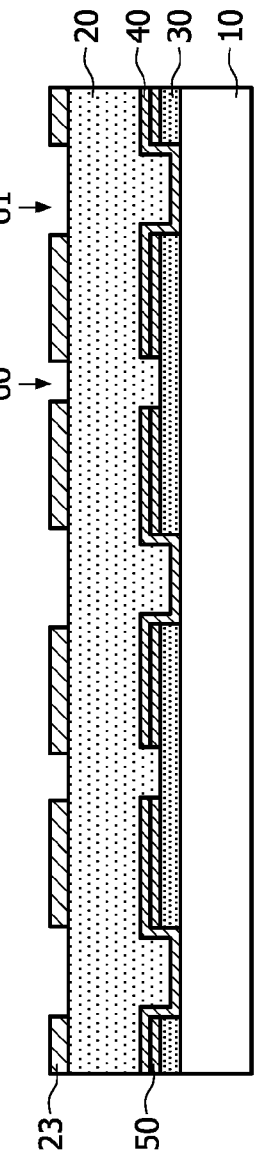
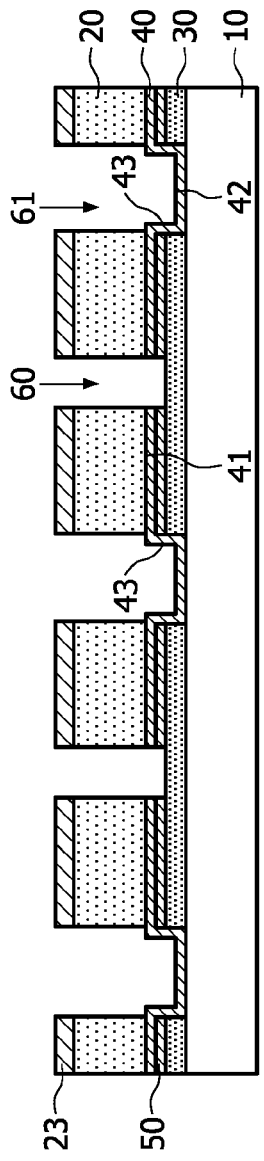
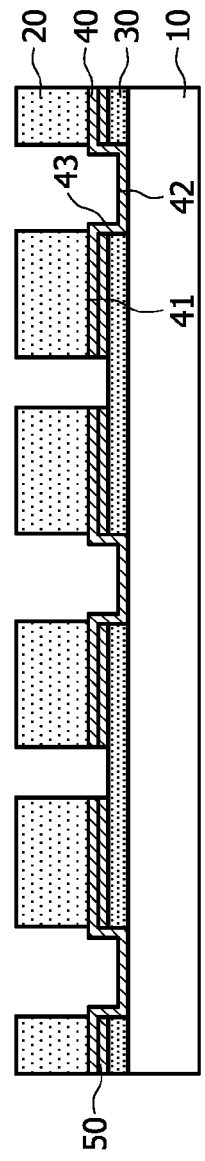
FIG. 4G
FIG. 4H
FIG. 4I
FIG. 4J

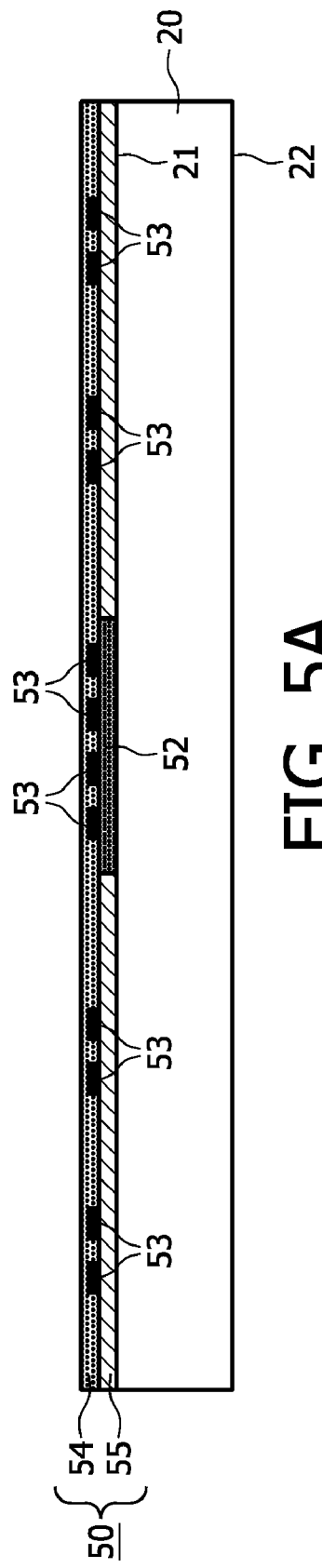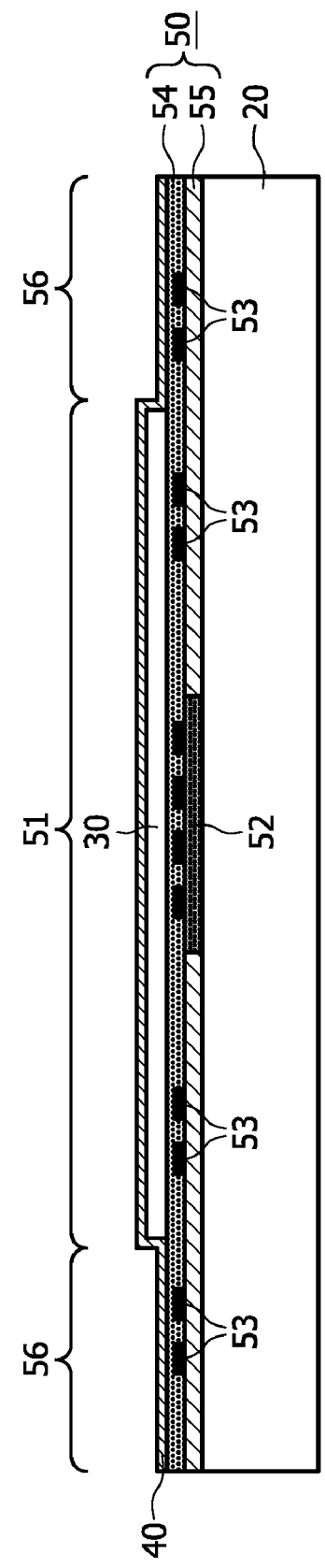

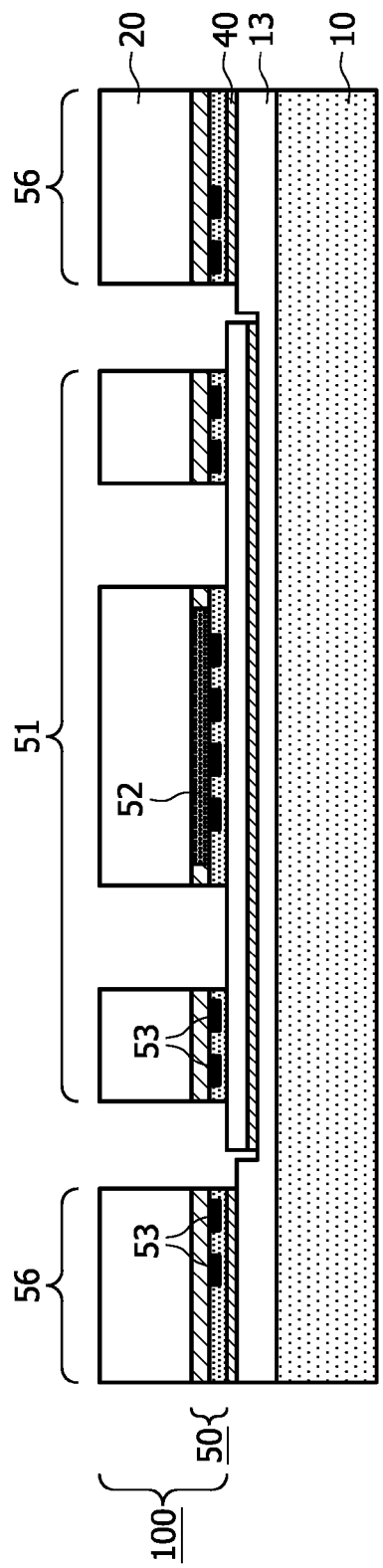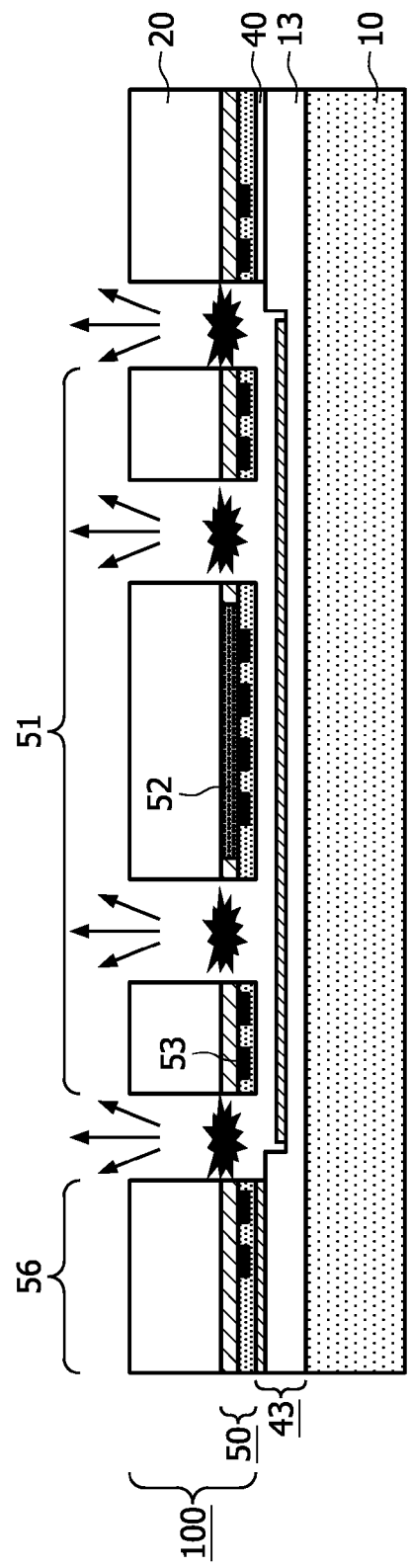

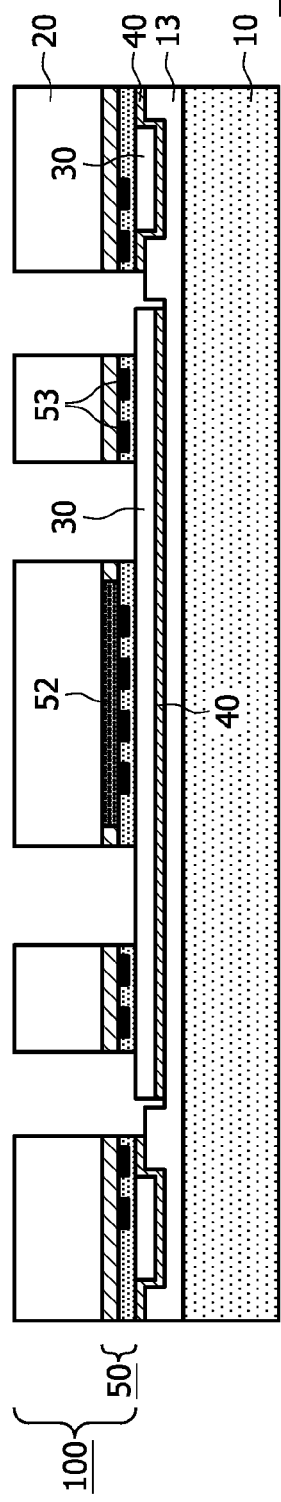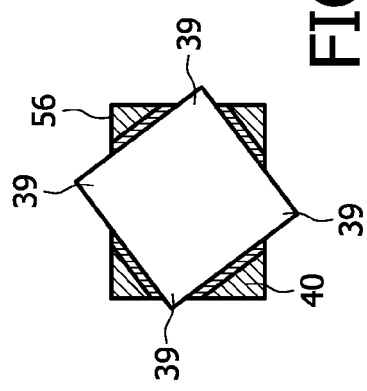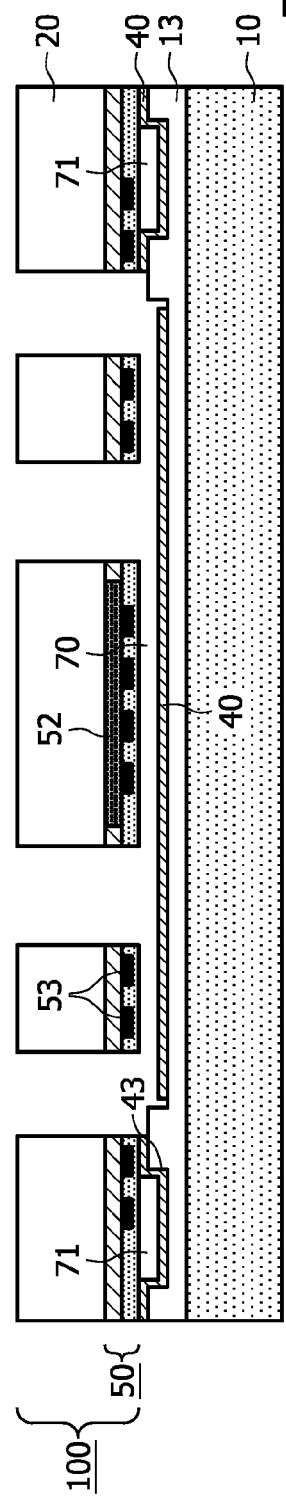

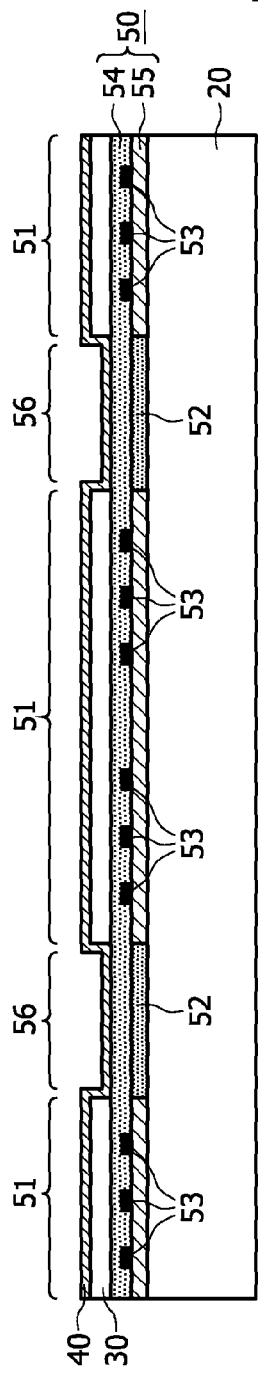
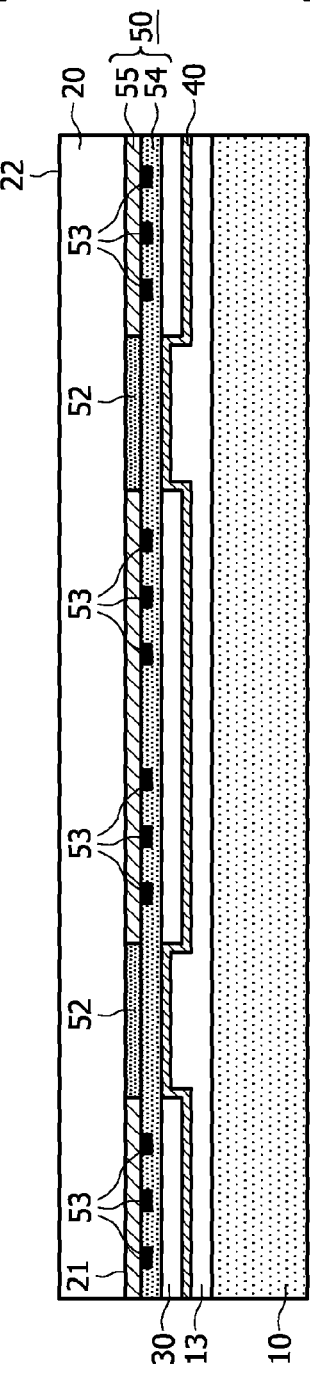
FIG. 7A
FIG. 7B
FIG. 7C

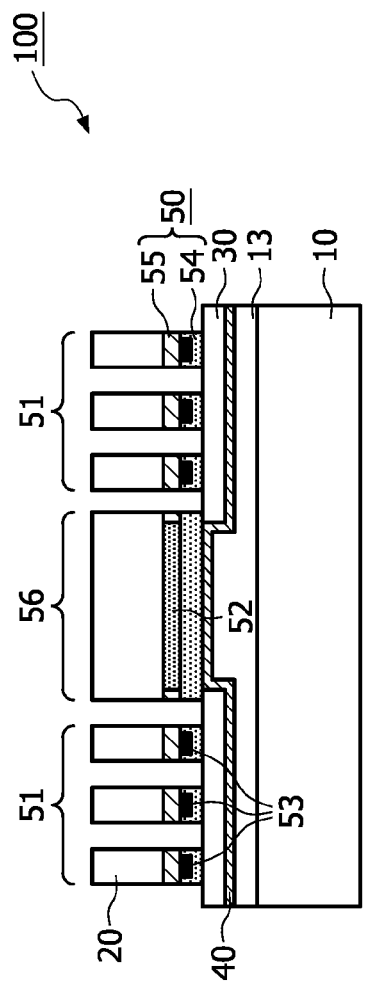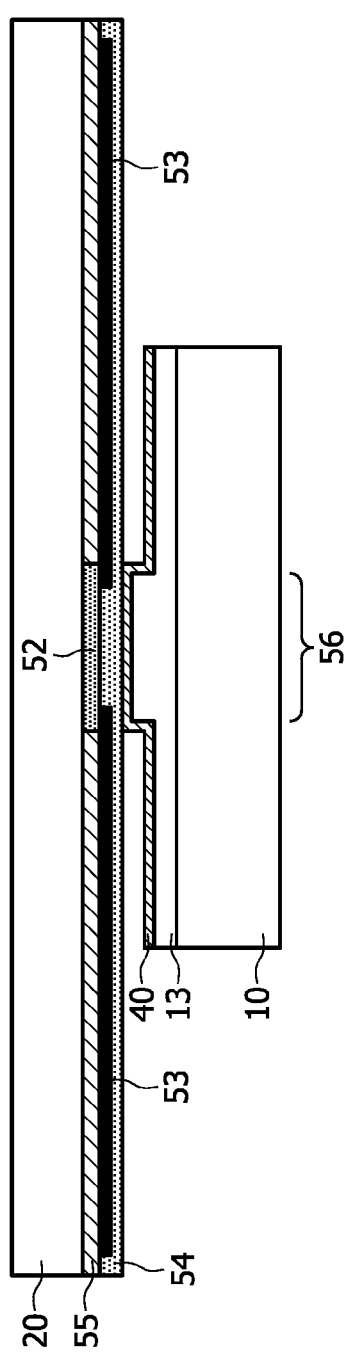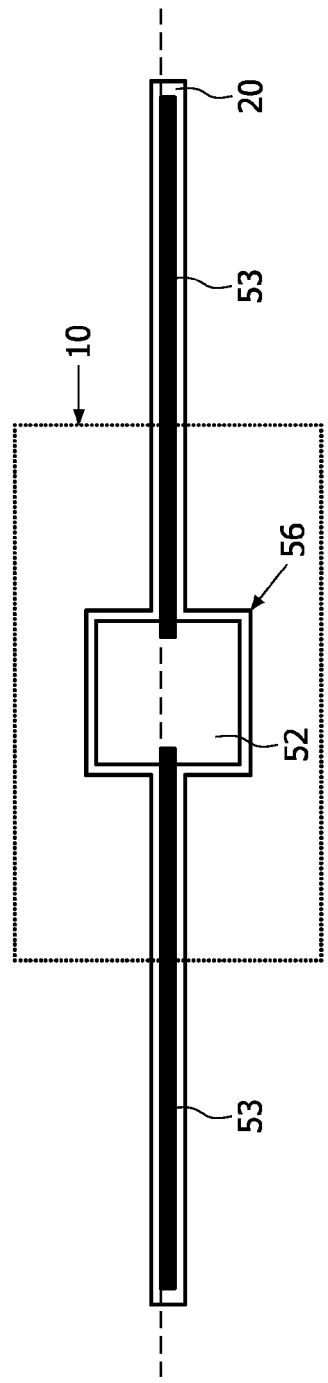

METHOD OF MANUFACTURING A PLURALITY OF SEMICONDUCTOR DEVICES AND CARRIER SUBSTRATE

The invention relates to a method of manufacturing a plurality of microelectronic devices attached to a carrier substrate, each of which devices comprises a circuit of electric elements, which method comprises the steps of:
 providing a carrier substrate with a patterned release layer and the devices, and
 removing the release layer, therewith generating air gaps between released areas of the microelectronic devices and the carrier substrate, which devices keep attached to the carrier substrate locally with bridging material that is disposed adjacent to the air gap.

The invention also relates to a carrier substrate to which is attached a plurality of microelectronic devices, each of which devices comprises a circuit of electric elements, and is separated from the carrier substrate through an air gap in a released area, which devices have been formed in a single batch, wherein the devices are attached to the carrier substrate locally with bridging material that is disposed adjacent to the air gap.

The method further relates to the use of the carrier substrate.

Such a method and such a carrier substrate are known from U.S. Pat. No. 5,258,325. Herein it is disclosed that a double transfer process may be used for transfer of a plurality of microelectronic devices from a substrate on which the devices are processed to a final carrier. This double transfer process is particularly aimed at the manufacture of an active matrix array for display applications. Microelectronic devices, as used herein, are in particular integrated circuits of active and/or passive elements and may include sensors.

The carrier substrate in known method is a silicon substrate. An oxide layer hereon is used as release layer. It is covered by a further protective layer of an silicon oxy-nitride layer, that is chosen to have a lower etching rate than the silicon oxide. Thereon, a single crystal layer of silicon is formed. The resulting substrate structure is thus of the silicon-on-insulator (SOI) type as known in the art. In and on the single crystal silicon layer the electronic devices are formed. These devices are semiconductor devices comprising thin film transistors with a polysilicon gate, with pixel electrodes, and with a suitable metallization.

Then, the bridging material is provided in the form of support posts of oxide that are provided in etched holes extending to the carrier substrate. Due to the smaller etch rate of the silicon oxynitride in comparison to the silicon oxide, the etch hole includes a narrowing in the plane of the silicon oxynitride. This narrowing leads to a mechanical anchoring of the oxide posts. Hereafter the oxide release layer is removed by etching. An epoxy is provided on the resulting structure and is cured in the areas that do not overlie the supports. A glass plate is attached thereto. Finally, the carrier substrate is removed from the devices by cleavage of the oxide posts and dissolution of the uncured epoxy.

It is a disadvantage of the known method that the devices cannot be separately obtained from the carrier substrate directly, e.g. by any equipment such as a component handling machine. After removal of the uncured epoxy, the glass plate must be separated into several pieces. Without the use of the glass plate, the plurality of device would fall apart in individual devices immediately.

It is therefore a first object of the invention to provide a method of the kind mentioned in the opening paragraph that results in a carrier substrate from which individual devices can be removed individually with standard or slightly modified component handling equipment.

It is a second object of the invention to provide a carrier substrate to which the individual devices are still attached.

This first object is achieved therein that the method comprises the steps of:
 providing a subassembly of a carrier substrate and a handling substrate, in between of which are present a patterned release layer and an adhesion layer, and which comprises the plurality of devices;
 applying through-holes through the handling substrate, at least some of which act as separation lanes between neighboring microelectronic devices, and
 removing the release layer through at least some of the through-holes, therewith generating air gaps between released areas of the microelectronic devices and the carrier substrate, which devices keep attached to the carrier substrate with the adhesion layer, of which a bridging portion is disposed adjacent to the air gap, such that an electronic device is individually removable from the carrier substrate by selective cleavage of the adhesion layer.

The desired substrate of the invention is achieved in that the release layer is removed only after that a handling substrate is applied and the needed through-holes are made through the handling substrate. And because the area between the handling substrate and the carrier substrate is accessible only through the through-holes, the bridging material must have been applied before or during the preparation of the subassembly, i.e. as an adhesion layer. A handling substrate is herein necessary for the individual removal of the device, i.e. otherwise the devices would be too fragile and too vulnerable.

Advantageously, the through-holes are made by etching. This has the advantage that the effective width of the through-holes, and particularly of any separation lanes can be very small. The width of a separation lane is herein not determined by the (sawing) technology used for the separation, but by the resolution of a simple etching step. This reduction of the width of the separation lane directly leads to an increase in yield and reduction in cost price, particularly if the carrier substrate is a semiconductor substrate. The separation lane in the prior art cannot be reduced as here in view of the need to separate the glass plate.

The release layer suitably comprises an organic material. This kind of materials may be relatively easy dissolved or removed selectively with respect to other materials.

In an advantageous embodiment, the release layer is removed by decomposing into gaseous material. The advantage of this type of release is that it does not leave behind any residue. Moreover, this decomposition may be effected at temperatures up to 400° C. The actual decomposition temperature is therein primarily dependent on the choice of the material of the release layer. A suitable material is for instance a polymethylmethacrylate (PMMA) that is offered as airgap material. The stability of this material to more than 300° C. allows carrying out a variety of process steps after the deposition of the release layer. Moreover, due to the decomposition temperature of less than 400° C., the decomposition will not damage other layers in the subassembly. Suitably, the material of the release layer is photosensitive, so that no further photoresist is needed for its patterning into the desired shape.

The adhesion layer suitably extends on one of the substrates, either the handling substrate or the carrier substrate, and is not merely a local posts. This leads thereto that the adhesion layer is herein fully integrated in the devices. Most suitably, the adhesion layer comprises an inorganic material, such as an oxide, an oxynitride or the like. Such materials may be applied in any desired thickness with standard semiconductor techniques, such as chemical vapor deposition. Moreover, these materials demonstrate a good adhesion to the preferably organic, release layer.

It is observed that the deposition of the adhesion layer on the patterned release layer is highly suitable, particularly if the adhesion layer is deposited in a manner so as to have a relatively uniform thickness—as compared to deposition in a manner so as to planarize existing topology. This manner of deposition results therein that the bridging portion of the adhesion layer has an internal plane that is not parallel to the substrates. As a consequence hereof, this bridging portion may be cleaved quite easy. The strength of the bridging portion as well the angle of the plane is of course dependent on the thickness of the adhesion layer and the release layer.

Suitably, the adhesion layer is designed to create the bridging portions that are present in the through-holes acting as separation lanes between the individual microelectronic devices. Suitably the bridging portions do not completely cover the separation lanes, but are patterned into stripes. More suitably, the adhesion layer is further patterned, as is the handling substrate so as to create additional through-holes to expose the release layer.

The handling substrate is preferably a layer of a polymeric material. However, it is not excluded that it is an inorganic coating with radiation inhibiting properties such as known from U.S. Pat. No. 6,198,155, which can be adequately patterned by modification of the surfacial properties. Alternatively, the handling substrate may be a heat sink or other heat dissipating means. Even a glass layer that is attached with an adhesive may be applied, provided that it is patterned subsequently. A suitable technique therefore is known from U.S. Pat. No. 6,177,295.

In one embodiment, the release layer, a device layer stack in which the devices are defined, and the adhesion layer are consecutively applied on the carrier substrate. In this embodiment, the devices are made by thin-film technology. This may include sensors, thin-film transistors, passive elements, filters and the like. Suitably, the circuit comprises transistors or other semiconductor elements. Suitable semiconductor materials that may be processed at temperatures below the decomposition temperature of the release layer, are not only organic semiconductors such as pentacene, but also amorphous and low-temperature polycrystalline silicon. One feature of this embodiment is that during the creation of the through-holes with etching, both the release layer and the adhesion layer suitably act as etch-stop materials.

In another embodiment, the release layer and the adhesion layer are consecutively applied to a processing substrate on which the devices are present, and then assembled to the carrier substrate, which processing substrate also is handling substrate or is replaced by the handling substrate after the assembly to the carrier substrate. The processing substrate is suitably, but not necessarily a semiconductor substrate at a surface of which some of the electrical elements are defined. After the provision of the subassembly, the processing substrate may be removed at least partially, usually by grinding followed by etching, and replaced by handling substrate with other properties, such as a polymer material. The devices are herein suitably provided with a passivation and scratch protection prior to the provision of the release layer. A first feature of this embodiment is the use of an adhesive to the carrier substrate in addition to the adhesion layer (i.e. oxide). One feature of this embodiment is that the provision of the through-holes is most suitably carried out in a two-step process: first through-holes are provided in the handling substrate, thereafter, the through-hole formation is continued with the patterning of the device layer stack and the adhesion layer thereon. Herein, the release layer and the adhesive act as etch-stop layers.

It is a second object of the invention of the invention to provide a carrier substrate with microelectronic devices that each comprises a circuit of electric elements, and which are individually removable thereof. This object is achieved in that each device is provided with a handling substrate and is separated from the carrier substrate through an air gap in a released area, wherein the devices have been formed in a single batch and are mutually separated by separation lanes extending through said handling substrate, wherein the devices are attached to the carrier substrate with an adhesion layer of which a bridging portion is disposed adjacent to the air gap and which adhesion layer further extends on at least one of the handling substrate and the carrier substrate, such that an microelectronic device is individually removable from the carrier substrate by selective cleavage of the adhesion layer.

The use of an adhesion layer that extends into the electronic devices leads thereto that the weakest point in the adhesion layer is at or near the contact with the carrier substrate. As a result, the adhesion layer can be broken there with a remarkably low force. As a result, the device can be taken away from the carrier substrate mechanically, i.e. with a component placement machine.

Advantageously, the adhesion layer comprises a first portion attached to the microelectronic device, a second portion attached to the carrier substrate and the bridging portion between the first and the second portion and adjacent to the air gap, said bridging portion including an angle with the carrier substrate between 0 and 180°. With this construction the bridging portions protrude with respect to the substrate and form a reliable connection although based on very thin layers.

In a preferred modification hereof, an electronic device is attached to the carrier substrate at a number of attachment points. Preferably, use is made of at least three attachment points, and more preferably of four attachment points. This leads to a stable construction that can be transported without any problems. As will be understood, more than one electronic device can be attached to the carrier substrate at a single attachment point; i.e. a strip of the adhesion layer contacts the carrier substrate at the attachment point, which strip extends at its lateral ends into different electronic devices.

Alternatively, the adhesion layer is provided with a first and an opposite second side and is in its bridging portion with its first side attached to the carrier substrate and with its second side attached to a portion of the encapsulated device or the handling substrate. In this embodiment, the devices are attached to the carrier substrate in merely a limited area. This embodiment appears particularly useful for devices further including larger or deformable elements, such as interconnects and antennas.

Suitably, the circuit of electric elements is provided with a protective layer and arranged between the handling substrate and the air gap. This embodiment provides protection to the microelectronic devices while being attached to the carrier substrate. Additionally, it has the advantage that known techniques for the generation of through-holes from the bottom side of a semiconductor substrate may be applied.

In one interesting embodiment, the microelectronic device comprises a deformable portion with at least one electrical conductor extending on the handling substrate, which portion has a shape that is substantially defined by the electrical conductor. Increasingly, there is interest in so-called stretchable electronics, in which deformable conductors between islands with electrical elements are used to enlarge the distance between these elements, and/or to take away stresses due to bending and the like. The desire to increase the mutual distance originates from the wish to make devices cost-effectively on a small area. Such a stretchable electronics structure is for instance disclosed in U.S. Pat. No. 6,479,890.

Use of stretchable electronics is expected for ultrathin and highly flexible RF ID transponders, wherein a magnetic loop antenna is integrated on the chip to eliminate the electrical contacts between the integrated circuit and an external antenna. As the size of the magnetic loop antenna does not scale with the circuit part of the RF ID transponder, a large part of the surface area of the substrate would be left unused. This makes it more expensive. A similar situation is available with respect to autonomous devices that scavenge energy and communicate to each other and/or to a base station. Such autonomous devices require an antenna, such as a dipole antenna, of a size relatively large to that of the integrated circuit to enable efficient transmission of RF energy. A solution proposed here is the fabrication of the antenna in a folded way and to unfold it after the microelectronic devices have been individualized.

Use of stretchable electronics is further expected in the sensor realm, wherein it is desired to have sensors that extend over a large area and are nevertheless adequately characterized.

In one embodiment hereof, the deformable portion is deformable so as to enlarge a lateral distance between its opposite ends. The deformable portion is for instance a conductor in the form of a spiral that can be unwound.

In another embodiment, the deformable portion is present between a first and a second unit of the circuit of electric elements.

In a further embodiment, the deformable portion comprises an antenna structure that is deformed by folding or unfolding.

The individual devices may be separated from the carrier substrate cleaving the adhesion layer in so far as it is attached to one semiconductor device. This can be suitably carried out with a component handling machine.

These and other aspects of the invention will be further elucidated with reference to the Figures, that are not drawn to scale and purely diagrammatical, and in which equal reference numerals refer to like parts:

Figure 1:
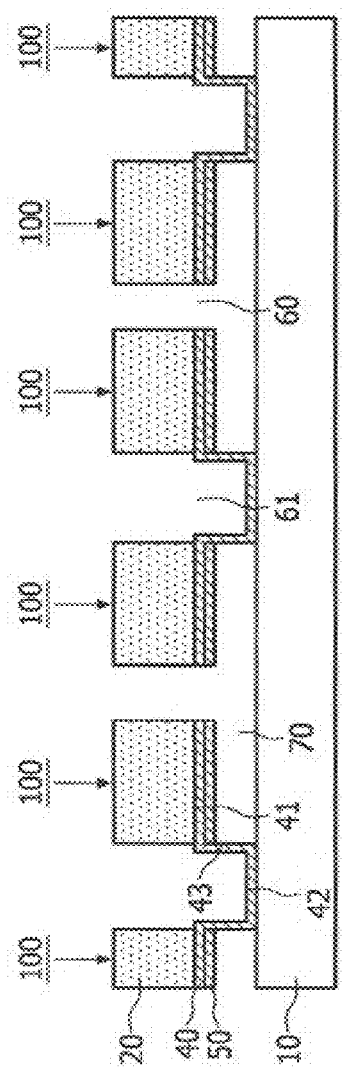
FIG. 1 shows a cross-sectional view of the carrier substrate with the devices.
Figure 5C:
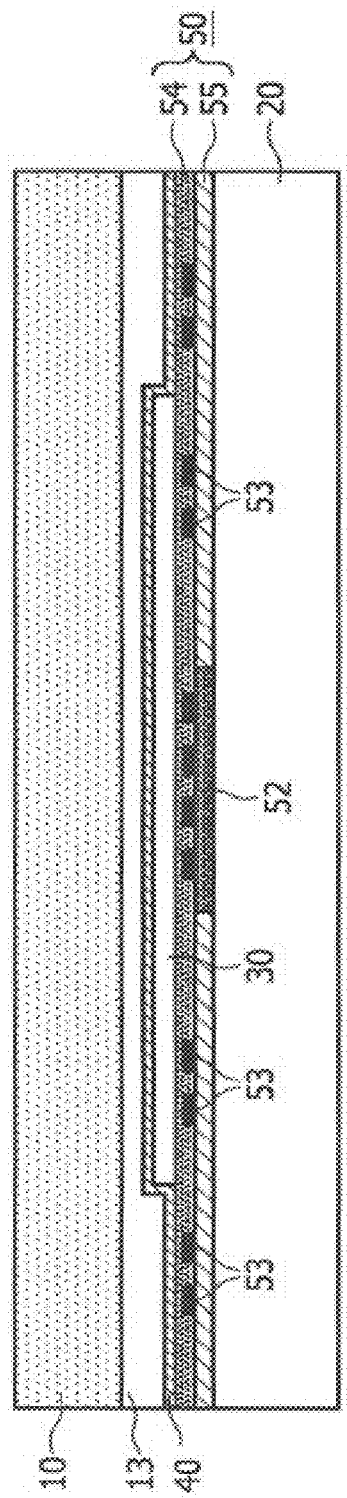

FIGS. 4A-J show in cross-sectional view ten consecutive steps of the manufacture of the carrier substrate as shown in FIG. 1;

FIGS. 5A-E show in cross-sectional view five consecutive steps of the manufacture of a second embodiment of the carrier substrate FIG. 5F shows in cross-sectional view a second embodiment of the carrier substrate with devices, as resulting from the method shown in FIG. 5A-E FIGS. 6A and C show in cross-sectional view a modification of the second embodiment of the carrier substrate;

FIG. 6B shows in top view a section of FIGS. 6 A and C

FIGS. 7A-C show in cross-sectional view three consecutive steps in a method of manufacturing a further embodiment FIGS. 8 and 9 show in cross-sectional view the resulting carrier substrate with a device in two configurations FIG. 10 is a top view corresponding to FIG. 9.

Figure 3:
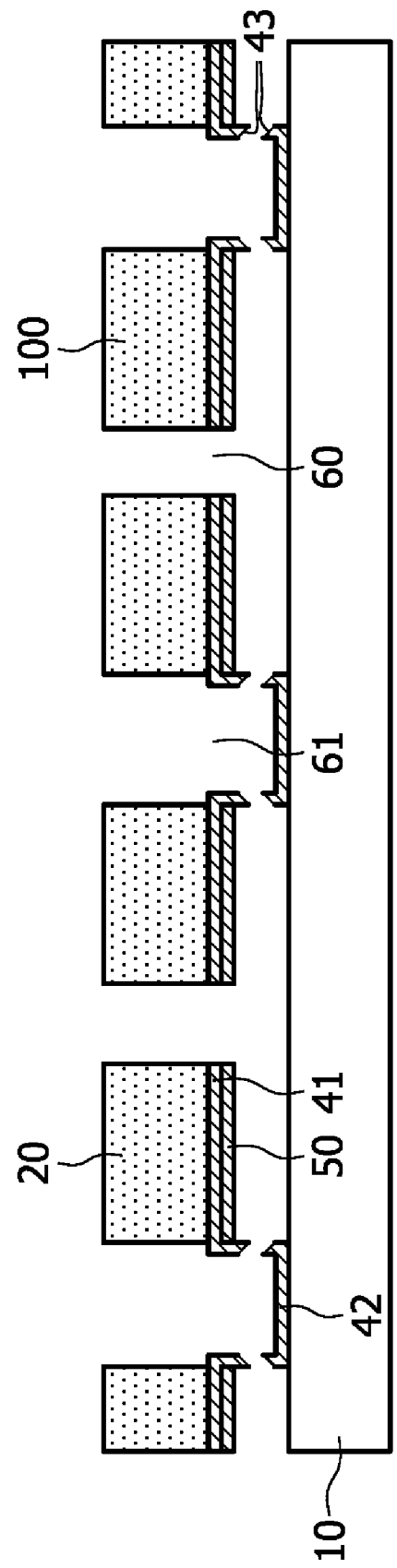
FIG. 3 shows a cross-sectional view of the carrier substrate after the devices have been removed thereof.

FIG. 1 shows a cross-sectional and diagrammatical view of the carrier substrate 10, to which are attached a plurality of microelectronic devices 100. The devices are attached with an adhesion layer 40. A first portion 41 of the adhesion layer 40 is part of the device 100, while a second portion 42 is attached to the carrier substrate 10. An intermediate, bridging portion 43 extends between the first and the second portions 41, 42. An air gap 70 extends between the microelectronic device 100 and the carrier substrate 10. The bridging portion 43 is located adjacent to this air gap 70. As can be seen in FIG. 3, this bridging portion 43 is cleaved when a microelectronic device is detached from the carrier substrate 10.

In order to be detached individually, for instance by a component placement machine, the microelectronic device 100 is provided with a handling substrate 20. The handling substrate 20 is in this example a polyimide layer with a thickness of for instance 10 micrometers, suitably any thickness between 2 and 100 micrometers. The microelectronic device 100 is further provided with a device layer 50, which is in this example a layer stack comprising thin film transistors. The semiconductor layer of the thin film transistors may be organic, amorphous silicon, polycrystalline silicon or any other semiconductor material suitable for thin film transistors and to be deposited at a temperature of at most about 300° C. Though not indicated, the present embodiment of the microelectronic device suitably comprises an integrated antenna. This enables wireless transmission between the device 100 and any reader, provided that the device 100 comprises the needed circuitry for receival and transmission of data and preferably energy. Such circuitry is known per se in the field of identification transponders. Alternatively or additionally, contact pads may be present for galvanic coupling between the device 100 and any component such as a printed circuit board. Such bond pads may be provided in the lowest part of the device layer 50 as will be clear from the cross-sectional view. Alternatively, the bond pads are provided on top of the handling substrate 20. Thereto, vertical interconnects are to be made through the handling substrate 20. Use of a photo-sensitive material for the handling substrate is thereto advantageous, but not necessary. The bond pads may be delimitnated with an oxide layer deposited on top of the handling substrate. Underbump metallization, metal bumps or solder bumps may be provided on the bond pads even prior to the separation.

The individual microelectronic devices 100 are mutually separated by separation lanes 61. Additionally, through-holes 60 are present so as to remove the release layer from the air gap 70. In this example, the through-holes act also act as separation lanes. However, it is not excluded, particularly for larger devices 100 that the through-holes 60 are located in the middle of a single device 100.

Figure 2:
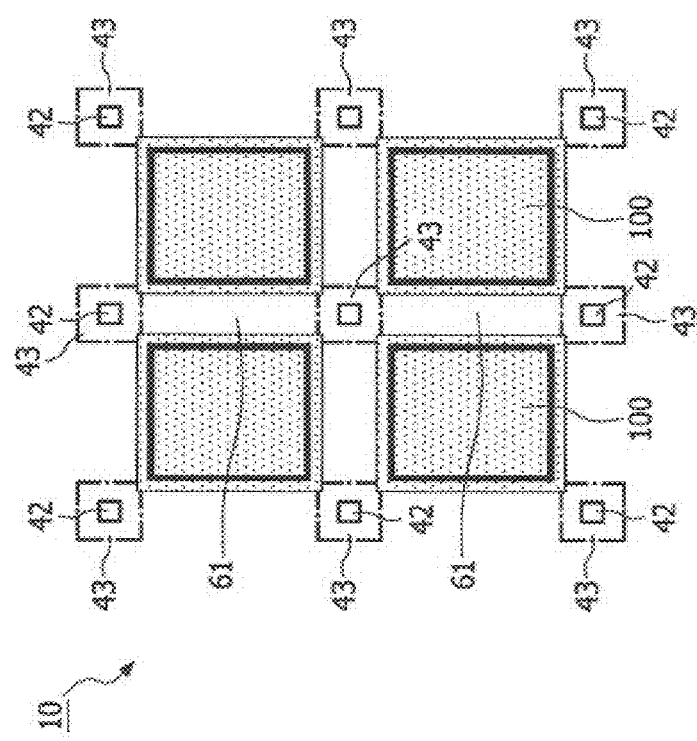
FIG. 2 shows a top view of the carrier substrate with the devices

FIG. 2 shows a top view of the carrier substrate 10 with a plurality of devices 100. The position of the handling substrate 20 is showed as a dotted field that overlaps with the devices 100. It also overlaps with the first portions of the adhesion layer (not shown). The second portions 42 of the adhesion layer are shown. Separation lanes 61 are additionally indicated. The bridging portions 43 are indicated by fields bordered with dot-dashed lines. FIG. 2 shows therewith that each device 100 in this example is attached to the carrier substrate 10 at four attachment points located adjacent a corner of a device.

FIGS. 4A-J show ten consecutive steps in the method to arrive at the carrier substrate 10 with the devices 100 as shown in FIG. 1.

FIG. 4A shows the carrier substrate 10 with a first side 11 and an opposite second side 12. A release layer 30 is present on the first side 11 of the carrier substrate 10. In this example, the carrier substrate comprises silicon, but could alternatively comprise another material, such as glass or the like. The release layer 30 comprises an polymethylmethacrylate material, such as developed for air gap in interconnect structures within an integrated circuit. Such a material is commercially available from Shipley as XP-0733. This material can be applied by spin-coating, and is after an initial soft bake at approximately 150° C. completely stable up to 300° C. If the temperature is increased to above 350° C., up to 400° C., the material decomposes without any residues. Instead of such airgap material, one may use release layers that can be selectively etched with respect to both the substrate and the layers deposited on top of the release layer. One example is for instance a metallic release layers.

FIG. 4B shows the carrier substrate 10 after a second step in which an etch mask and device layer 50 has been applied. Suitably, particularly in combination with the organic release layer 30, the etch mask comprises an inorganic material. Good results have been obtained with an oxide as deposited with phase enhanced chemical vapor deposition (PECVD). However, nitrides, oxynitrides and other materials, as well as other deposition methods could be applied. This etch mask is simultaneously a substrate layer, onto which the device layer 50 is deposited. In this example, the device layer 50 is a stack of layers. One of those comprises a semiconductor material, such as amorphous silicon or low-temperature polycrystalline silicon. Further layers are electrically conductive and electrically insulating, so as to define electrodes and conductors, as well as isolation in between thereof. The device layer 50 then will contain a plurality of electrical elements, such as transistors, capacitors and resistors that are interconnected according to a desired design. Additionally, there is also a need to provide coupling means into the device. Such coupling means for energy and or data may be embodied as an antenna, such as a dipole antenna, an inductor or capacitive coupling plates. Alternatively, the coupling means may be embodied as contact pads for galvanic coupling. Suitably, herein, such contact pads are defined adjacent to the release layer 30.

FIG. 4C shows the carrier substrate 10 after a third step, in which the device layer 50 has been patterned. Evidently, the patterning of the device layer 50 is carried out in areas that are kept free from any electrical elements. The patterning is suitably done with a photoresist and illumination.

Figure 4D:
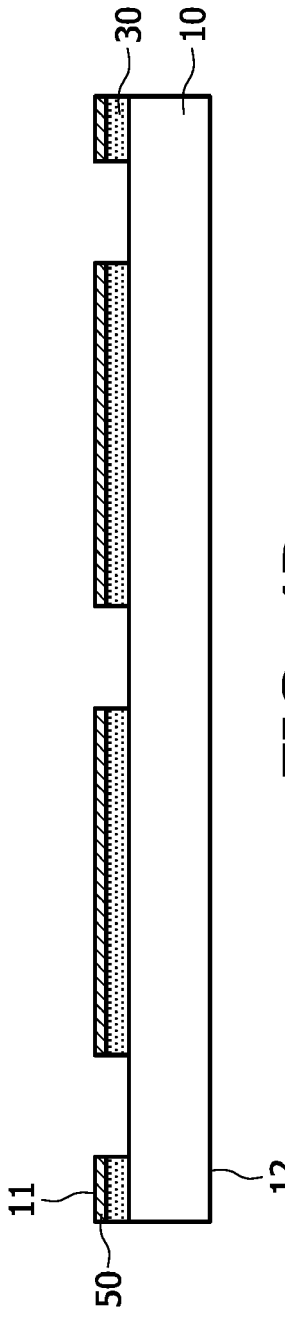

FIG. 4D shows the carrier substrate 10, after that the release layer 30 has been patterned. Herein, adhesion areas are defined on the carrier substrate 10.

Figure 4E:
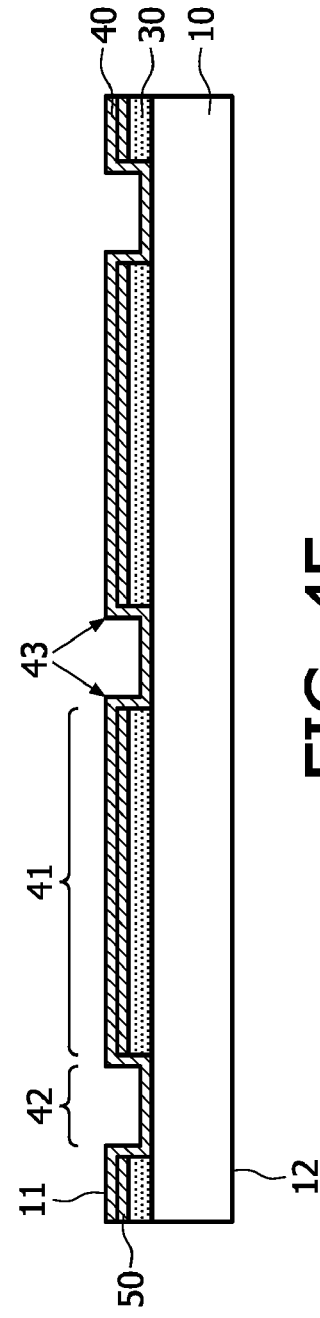

FIG. 4E shows the carrier substrate 10 after a further step, in which an adhesion layer 40 is applied on top of the device layer 50. As a result of the patterning of both the device layer 50 and the release layer 30, part of the adhesion layer is attached to the carrier substrate. Thus, the adhesion layer 40 may be subdivided into at least three portions: a first portion 41, that is deposited on the device layer 50; a second portion 42 that is deposited on the carrier substrate 10; and a bridging portion 43 extending between the first and the second portions 41,42. This bridging portion 43 includes an angle with the carrier substrate between 0 and 180° C. In this example, the angle is about 90°, which is evidently a diagrammatical view. Generally, the angle will be in a steepest point at least 30°, and more preferably at least 45°, and at most 150°, more preferably at most 135°. It is preferred to have an angle near to 90°, as this tends to limit the force with which a device has to be taken off from the carrier substrate 10. It furthermore tends to reduce the risk that the adhesion layer would be cleaved anywhere else than in the bridging portion 43.

Figure 4F:
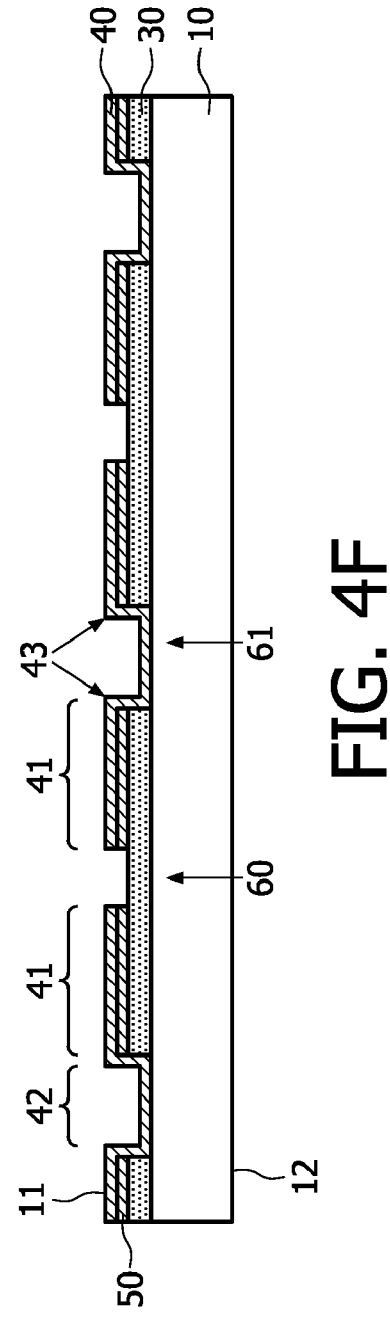

FIG. 4F shows the carrier substrate 10 after patterning of the adhesion layer 40. Herein, through-holes 60 are defined that give access to the release layer 30. Simultaneously, this step also defines separation lanes 61.

In the step shown in FIG. 4G a handling substrate 20 is applied on the adhesion layer 40. This handling substrate 20 is in this example a resin layer, which allows that the resulting device is mechanically flexible. A thickness of 10 microns is used. A preferred example of a resin layer is a polyimide, which is applied by spincoating. In this example, the resin layer is not photosensitive. As a consequence an additional photoresist layer 23 is applied on top of the resin layer 20. This resist layer is applied after the resin layer has been dried by soft-baking at 120° C.

FIG. 4H shows then the result of the patterning of the photoresist layer 23. The pattern of the photoresist layer overlaps with the earlier defined separation lanes 61 and through-holes 60. The pattern may even be largely identical therewith, although it appears useful to apply corrections in the resolution. Also the pattern may be different near to the edge of the carrier substrate 10.

FIG. 4I shows the carrier substrate 10 after patterning of the handling substrate 20. This may be done with an etchant such as TMAH.

FIG. 4J shows the carrier substrate 10 after removal of the photoresist layer 23. The carrier substrate 10 with the individual devices 100 attached to it, is now nearly ready. In this example, the step of curing the resin layer in the handling substrate 20 is carried out simultaneously with the removal of the release layer 30, as one needs the same temperature for both steps. The result of that step is shown in FIG. 1.

FIGS. 5A-F shows diagrammatical cross-sectional views of a second embodiment of the method of the invention. This embodiment is structurally different from the first embodiment, in that the handling substrate 20 is herein a processing substrate for the devices 100. The release layer 30 is applied only at the end of the processing. This evidently has the advantage that temperatures above 300° C. may be used. Moreover, use can be made of a substrate of monocrystalline silicon, which allows devices with higher performance, and enables the processing in conventional semiconductor fabs.

As a consequence of the processing, the carrier substrate acts only as a temporary carrier. I.e. there is not a substrate transfer such as in the first embodiment. However, such a substrate transfer may be carried out additionally, in that the processing substrate is at least partially removed and replaced by another substrate. Such other substrate could be metallic, but is suitably electrically insulating and mechanical flexible, such as for instance a resin layer of the kind used in the first embodiment.

This second embodiment is additionally different, in that herein a first part of the circuit is released from the carrier substrate 10 by removal of the release layer 30, while a second part is not released. This is particularly suitable if the first, released part may be mechanically deformed. Such deformation may be carried out with folding, stretching and bending, for which object it is preferred to include specific means.

FIG. 5A shows a cross-sectional view of the processing and handling substrate 20 with a first side 21 and a second side 22. A stack of layers is defined on the first side 21 that will also be referred to as the device layer 50. A thermal oxide 55 is provided on the first side 21 of the handling substrate 20. An integrated circuit 52 is defined on the first side 21 in a manner known to the skilled person. At least one conductor 53 is provided on the first side 21. Although as shown here on top of the integrated circuit 52, it is preferred that this conductor 53 is part of one of the conductor layers in the interconnect structure of the integrated circuit 52. In this example, the conductor 53 is a spiraling conductor track that is designed to be stretchable. Evidently, the conductor 53 could constitute an antenna such as a dipole antenna or an inductor winding. Alternatively, more than one integrated circuit 52 of electrical elements could be present and could be coupled through the conductor tracks. Such a structure appears advantageous for the mechanical properties of flexible circuits. Another application is considered in the field of sensor arrays. The sensors may then be brought at a larger distance of each other after processing. The circuit comprising both the conductor 53 and the integrated circuit 52 is covered by a protecting layer 54. This protecting layer 54 is suitably a passivation layer, for instance of silicon nitride. That is particularly enabled if the conductor 53 is part of the interconnect structure. Alternatively, the conductor 53 may be provided on top of a passivation layer of the integrated circuit. Then the protecting layer does not need to include a passivation function and may be chosen from a wider range of materials.

FIG. 5B shows the handling substrate 20 after a second step in the method. Herein a release layer 30 has been applied and patterned. Subsequently, an adhesion layer 40 is applied. The same materials are chosen here for the release layer 30 and the adhesion layer 40 as in the first embodiment. This however does certainly not exclude other materials. As a consequence of the patterning of the release layer 30, the device 100 may be divided into a released area 51 in which the adhesion layer 40 is not attached to the device layer 50, and an attached area 56. A part of the conductors 53 is herein defined in the attached area 56, while another part of the conductors 53 and the integrated circuit 52 is defined in the released area 51.

FIG. 5C shows an assembly of handling substrate 20 and carrier substrate 10. Herein the carrier substrate 10 is attached with an adhesive 13 to the adhesion layer 40. Suitably, the carrier substrate 10 is herein a glass layer, but it could be any other body that is sufficiently stable and rigid to act as a substrate during etching. The adhesive is suitably chosen so as to have an etch resistance against an etchant that is able to etch the adhesion layer and that is not able to etch the release layer. One embodiment hereof is evidently, that the adhesive is chosen from the same class of material as the release layer, e.g. preferably also an organic layer, more preferably an ester-type of material if the release layer comprises PMMA, even more preferably an acrylate and most suitably also PMMA, however in another version that is not decomposable.

Figure 5D:
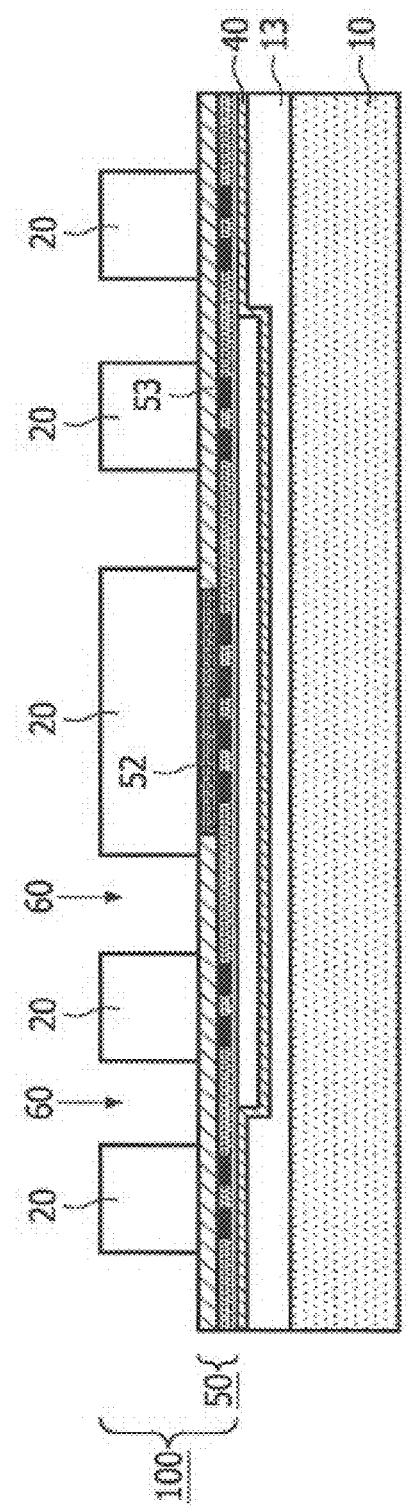

FIG. 5D shows the assembly that has been reversed, so that the carrier substrate 10 now acts as the carrier. Additionally, the handling substrate 20 is herein patterned into islands separated by through holes 60, which are suitably designed as lanes. Herewith the conductor 53 is provided with a handling substrate 20 that is mechanically attached to the handling substrate 20 of the integrated circuit 52 only at limited area, e.g. substantially where the conductors 53 contact the integrated circuit 52. Effectively, also separation lanes will be provided, but these are not shown here. The provision of trenches into a silicon substrate is well known in the art and is suitably carried out with dry etching through a mask of silicon nitride. The thermal oxide 55 functions here as etch-stop layer. Although not shown here, the handling substrate 20 is suitably thinned prior to the definition of the through-holes.

FIG. 5E shows the carrier substrate 10 with the device 100 after continuation of the etching. This etching is carried out with reactive ion etching (RIE), also other techniques such as laser ablation and the like are not excluded. Here, in a preferred example, the adhesive 13, the release layer 30 and the adhesion layer 40 are chosen such that the adhesion layer is etched away, while the release layer 30 and the adhesive 13 act as etch stop layer. Herewith, the release layer 30 is exposed.

FIG. 5F shows the carrier substrate 10 with the device 100 after removal of the release layer 30. Now the released area 51 of the device 100 is separated from the carrier substrate 10 with an air gap 70. Adjacent to the air gap is a bridging portion 43 of the adhesion layer. This may be cleaved in order to remove the device 100 individually from the carrier substrate 10. Here, the bridging portion is to be understood as the combination of the adhesion layer 40 and the adhesive 13. Any cleavage may go through either of them or both. Since the device is actually designed to be stretchable and the attached area only contains part of a conductor 53, it is not problematic that the adhesion to the carrier substrate 10 in the attached areas is stronger. Additionally, as the adhesive 13 may be relatively thick, the cleavage may be supported with some instruments, such as a saw or the like.

FIG. 6A and FIG. 6C shows cross-sectional views of a modification of this second embodiment, in which the force to remove the devices 100 individually from the carrier substrate 10 is reduced as compared to FIG. 5. Although this modification is shown here with reference to an illustration of a device with stretchable conductors 53, it is certainly not limited thereto and may also be applied to devices similar to those shown in FIG. 1. Herein the release layer 30 is patterned such to be present below a portion of the attached area 51 of the device 100. The release layer 30 is then exposed in that it extends to the edge of the attached area 56 at some areas only. Particularly, FIG. 6B shows that with a rotation of the mask of the release layer 30 in comparison to the mask of the attached area 56 (e.g. the mask to pattern the handling substrate 20), the release layer is exposed at the edge of the attached area in exposure points 39. It will be understood that there are many more manners to define exposure points 39 in addition to rotation of one feature in the mask. One example is for instance translation, another is the use of a cross-like pattern for either the pattern of the release layer 30 or the attachment area 56. One advantage of this mask operation is that no additional patterning of a layer is needed.

FIG. 6C then shows the result, wherein the bridging portion 43 is limited to a strictly limited area, and an additional air gap 71.

FIGS. 7-10 relate to another embodiment according to the invention; however, it can be seen, for instance from FIG. 8, that it is not explicitly necessary in this embodiment to remove the carrier substrate after processing. Moreover, the carrier substrate is herein diced into individual units prior to a deformation step of the device layer. It will however be understood, that the carrier substrate is removed in a preferred embodiment, so as to enable the flexibility of the device. It will be moreover understood that the implementation as shown in FIG. 6A-C is highly advantageous also in this embodiment.

FIGS. 7A-C shows three steps in the method leading to the device as shown in FIG. 8. As before, all cross-sectional drawings are diagrammatical in nature. The method is principally the same as the method explained with reference to FIGS. 5A-F. If not explained else, the details mentioned with reference to FIGS. 5A-F apply also to the method of this embodiment.

FIG. 7A shows a stage comparable to that shown in FIG. 5B. The shown portion comprises in this example two individual devices. The handling substrate 20 is provided with a thermal oxide layer 55 and an integrated circuit 52. Hereon, conductors 53 are applied, which are designed in a manner to be deformable by folding, as will be explained with reference to FIGS. 9 and 10. The conductors 53 suitably extend into the integrated circuit 52, particularly the portion known as the 'interconnect structure' or 'back end'. The structure of conductors 53 and integrated circuit 52 is covered with a passivation layer 54, resulting in a device layer stack 50. Hereon, a release layer 30 is applied and patterned appropriately, according to a desired pattern. The release layer 30 is then covered with an adhesion layer 40. Due to the applied patterning, released areas 56 and attached areas 51 can be distinguished. In this embodiment, the attached area 51 corresponds to the area of the integrated circuit 52, while the released area corresponds to the area of the conductors 53.

FIG. 7B shows a further stage, in which a carrier substrate 10 is attached on the first side 21 of the handling substrate 20 with an adhesive 13. This adhesive constitutes a bond between the carrier substrate 10 and the adhesion layer 40. Thereafter, the handling substrate 20 is thinned from its second side to any suitable thickness. Although not shown here, it could be replaced, partially or nearly completely (without damaging the integrated circuit 52), with a flexible layer, such as a polyimide, a polyacrylate, an epoxy or the like.

FIG. 7C shows then a further stage, in which the handling substrate 20 is patterned. This stage corresponds to the stage shown in FIG. 5E. Particularly, the handling substrate 20, and any device layer 50 thereon is removed in areas in which neither an integrated circuit 52 nor a conductor 53 is present. This removal creates separation lanes 61 and other through-holes 60, the latter being in the shape of channels or the like.

FIG. 8 shows the resulting device 100 after a dicing step. Herein, the carrier substrate 10 is individualized. Thereafter, the adhesion layer may be removed, so as to release the conductors from the carrier substrate 10. It is observed, that the dicing operation could be postponed until after the removal of the release layer 30. Although the individual devices 100 are not very mechanically robust in that stage, the separation lanes do not cut through the handling substrate 20 or any device layer 50. It is further observed that the device 100 could be removed from the carrier substrate 10 without separating the carrier substrate 10. This however is less preferred, as will be explained with reference to FIG. 9.

FIG. 9 shows the device 100 after removal of the release layer 30 and after deformation of the conductors. In this embodiment, the conductors are deformed by unfolding them. The resulting structure is for instance a dipolar antenna. Other structures could be formed, for instance with a cut, fold and extend technique as described in the non-prepublished application PH890, which is included herein by reference. Most suitably, the conductors are provided such, that the deformation is achieved directly when removing the release layer 30.

FIG. 10 shows the device 100 of FIG. 9 in a top view. The effect of the deformation is clear. Furthermore, it will be understood that it is suitable to attach the deformed structure to any further carrier, so as to safeguard it against damage.

In short, individual devices (100) are locally attached to a carrier substrate (10), so that they can be removed therefrom individually. This is achieved through the use of a patterned release layer, particularly a layer that is removable through decomposition into gaseous or vaporized decomposition products. The mechanical connection between the carrier substrate (10) and the individual devices (100) is provided by a bridging portion (43) of an adhesion layer (40).

REFERENCE NUMERALS 10 carrier substrate
11 first side of carrier substrate
12 second side of carrier substrate
13 adhesive
20 handling substrate
21 first side of handling substrate
22 second side of handling substrate
23 photoresist layer
30 release layer
33 etch mask (oxide layer)
40 adhesion layer
41 first portion of adhesion layer
42 second portion of adhesion layer
43 bridging portion of adhesion layer
50 device layer
51 released area
52 integrated circuit
53 conductor
54 protecting layer
55 thermal oxide layer
56 attached area
60 through-holes
61 separation lanes
70 air gap
100 microelectronic device

The invention claimed is:

1. A method of manufacturing a carrier substrate to which a plurality of microelectronic devices is attached, each of the devices including a circuit of electric elements, the method comprising:

providing a subassembly of a carrier substrate and a handling substrate, wherein a patterned release layer and an adhesion layer are present between the subassembly and the handling substrate, wherein the adhesion layer is provided with a first side and an opposite second side, the first side being attached to the subassembly and the second side being attached to a portion of the handling substrate and a bridging portion extends from the first side to the second side;

forming through-holes through the handling substrate as separation lanes between neighboring microelectronic devices, and removing the release layer through at least some of the through-holes to generate air gaps between released areas of the microelectronic devices and the carrier substrate, wherein the devices remain attached to the carrier substrate through the bridging portion of the adhesion layer, wherein the bridging portion of the adhesion layer is disposed adjacent to the air gap, such that a microelectronic device is individually removable from the carrier substrate by selective cleavage of the bridging portion of the adhesion layer.

2. A method as claimed in claim 1, wherein the release layer is removed by decomposing into gaseous material.

3. A method as claimed in claim 1, wherein the release layer, a device layer stack in which the devices are defined, and the adhesion layer are consecutively applied on the carrier substrate, wherein the adhesion layer is patterned to create exposure areas to the release layer corresponding to a first subset of separation lanes, but is continuous in a second subset of separation lanes so as to adhere the devices to the carrier substrate after removal of the release layer.

4. A method as claimed in claim 1, wherein the release layer and the adhesion layer are consecutively applied to a processing substrate on which the devices are present, and then assembled to the carrier substrate, wherein the processing substrate is the handling substrate or replaced by the handling substrate after the assembly to the carrier substrate.

5. A method as claimed in claim 1, wherein the handling substrate includes a flexible material.

6. A carrier substrate for attaching a plurality of microelectronic devices, each of the devices comprises a circuit of electric elements and is provided with a handling substrate and separated from the carrier substrate through an air gap in a released area, wherein the devices are formed in a single batch and mutually separated by separation lanes extending through said handling substrate, wherein the devices are attached to the carrier substrate with an adhesion layer having a bridging portion disposed adjacent to the air gap and having an adhesion layer further extended on the handling substrate and the carrier substrate, wherein the bridging portion extends from said handling substrate to the carrier substrate, such that a microelectronic device is individually removable from the carrier substrate by selective cleavage of the bridging portion of the adhesion layer.

7. A carrier substrate as claimed in claim 6 wherein the adhesion layer comprises a first portion attached to the microelectronic device, a second portion attached to the carrier substrate and the bridging portion between the first and the second portion and adjacent to the air gap, said bridging portion including an angle with the carrier substrate greater than 0 degrees and less than 180°.

8. A carrier substrate as claimed in claim 7, wherein each microelectronic device is attached to the carrier substrate with a plurality of bridging portions of the adhesion layer.

9. A carrier substrate as claimed in claim 6, wherein the circuit of electric elements is provided with a protective layer and arranged between the handling substrate and the air gap.

10. A carrier substrate as claimed in claim 6, wherein the microelectronic device includes a deformable portion with at least one electrical conductor extending on the handling substrate, wherein the deformable portion has a shape that is substantially defined by the electrical conductor.

* * * * *